(12) United States Patent
Capodieci (10) Patent No.: US 7,799,517 B1
(45) Date of Patent: Sep. 21, 2010

(54) SINGLE/DOUBLE DIPOLE MASK FOR CONTACT HOLES

(75) Inventor: Luigi Capodieci, Santa Cruz, CA (US)

(73) Assignee: GlobalFoundries Inc., Grand Cayman (KY)

( * ) Notice: Subject to any disclaimer, the term of this patent is extended or adjusted under 35 U.S.C. 154(b) by 337 days.

(21) Appl. No.: 10/930,432

(22) Filed: Aug. 31, 2004

(51) Int. Cl.
*G21K 5/10* (2006.01)
*G03C 5/04* (2006.01)

(52) U.S. Cl. .................... 430/396; 430/394; 430/5; 250/492.2; 250/492.22

(58) Field of Classification Search ................ None
See application file for complete search history.

(56) References Cited

U.S. PATENT DOCUMENTS

| | | | |
|---|---|---|---|
| 6,553,562 B2 | 4/2003 | Capodieci et al. | |
| 6,855,486 B1 * | 2/2005 | Finders et al. | 430/394 |
| 7,033,734 B2 * | 4/2006 | Chandhok | 430/311 |
| 2006/0126046 A1 * | 6/2006 | Hansen | 355/55 |

* cited by examiner

*Primary Examiner*—Daborah Chacko Davis
(74) *Attorney, Agent, or Firm*—Farjami & Farjami LLP (57) ABSTRACT

A method of forming a feature on a device is disclosed. A photo resist layer is formed over the device and a dipole illuminator having a pole orientation axis in a first direction is used to expose a first geometrical pattern onto the resist layer. The first geometrical pattern is substantially oriented in the same direction as the pole orientation axis of the dipole illuminator. A dipole illuminator having a pole orientation axis substantially orthogonal to the first direction then is used to expose a second geometrical pattern onto the resist layer. The second geometrical pattern is oriented substantially orthogonal to the first direction.

17 Claims, 6 Drawing Sheets

SINGLE/DOUBLE DIPOLE MASK FOR CONTACT HOLES

TECHNICAL FIELD

The present invention relates generally to the field of integrated circuit manufacture and, more particularly, to patterning sub-100 nm contact holes utilizing dipole illumination.

BACKGROUND

Lithographic apparatus can be used, for example, in the manufacture of integrated circuits (ICs). In such a case, the mask will generally contain a circuit pattern corresponding to an individual layer of the IC, and a projection beam of radiation will be used to image this pattern onto various target portions on a substrate (e.g., a silicon wafer) that has been coated with a layer of radiation-sensitive material (e.g., resist). In general, a single wafer will contain a whole network of adjacent target portions that are successively irradiated, one at a time. In one type of lithographic apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern through the projection beam in a given reference direction (the "scanning" direction) while synchronously scanning the substrate parallel or anti-parallel to this direction. More information with regard to lithographic apparatus as here described can be obtained, for example, from U.S. Pat. No. 6,046,792, the entire contents of which is hereby incorporated by reference.

Lithographic apparatus may employ various types of projection radiation, non-limiting examples of which include ultra-violet light ("UV") radiation (e.g., with a wavelength of 365 nm, 248 nm, 193 nm, 157 nm or 126 nm), extreme UV ("EUV"), X-rays, ion beams or electron beams. Depending on the type of radiation used and the particular design requirements of the apparatus, it may include a projection system having refractive, reflective or catadioptric components, and include vitreous elements, grazing-incidence mirrors, selective multi-layer coatings, magnetic and/or electrostatic field lenses, etc; for simplicity, such components may be loosely referred to, either singly or collectively, as a "lens".

In a manufacturing process using such a lithographic projection apparatus, a pattern in a mask is imaged onto a wafer which is at least partially covered by a layer of resist. Prior to this imaging step, the wafer may undergo various procedures, such as priming, resist coating and a soft bake. After exposure, the wafer may be subjected to other procedures, such as a post-exposure bake (PEB), development, a hard bake and measurement/inspection of the imaged features. This array of procedures is used as a basis to pattern an individual layer of a device, e.g., an integrated circuit (IC). Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the wafer. These devices are then separated from one another by a technique such as dicing or sawing. Thereafter, the individual devices can be mounted on a carrier, connected to pins, etc. Further information regarding such processes may be obtained, for example, from the book "Microchip Fabrication: A Practical Guide to Semiconductor Processing", Third Edition, by Peter van Zant, McGraw Hill Publishing Co., 1997 ISBN 0-07-067250-4.

Of course, one of the goals in integrated circuit fabrication is to faithfully reproduce the original circuit design on the wafer (via the mask). Another goal is to use as much of the semiconductor wafer real estate as possible. As the size of an integrated circuit is reduced and its density increases, however, the CD (critical dimension) of its corresponding mask pattern approaches the resolution limit of the optical exposure tool. The resolution for an exposure tool is defined as the minimum feature that the exposure tool can repeatedly expose on the wafer. The resolution value of present exposure equipment often constrains the CD for many advanced IC circuit designs.

Furthermore, the constant improvements in microprocessor speed, memory packing density and low power consumption for micro-electronic components are directly related to the ability of lithography techniques to transfer and form patterns onto the various layers of a semiconductor device. The current state of the art requires patterning of CD's well below the available light source wavelengths. For instance the current production wavelength of 248 nm is being pushed towards patterning of CD's smaller than 100 nm. This industry trend will continue and possibly accelerate in the next 5-10 years, as described in the International Technology Roadmap for Semiconductors (ITRS 2000).

Lithographic methods aimed at improving resolution, while retaining acceptable process latitude and robustness, are classified as Resolution Enhancement Techniques (RET's) and include a very wide range of applications. Examples include: light source modifications (e.g., Off-Axis Illumination), use of special masks, which exploit light interference phenomena (e.g., Attenuated Phase Shift Masks, Alternating Phase Shift Masks, Chromeless Masks, etc.), and mask layout modifications (e.g., Optical Proximity Correction).

Figure 1:
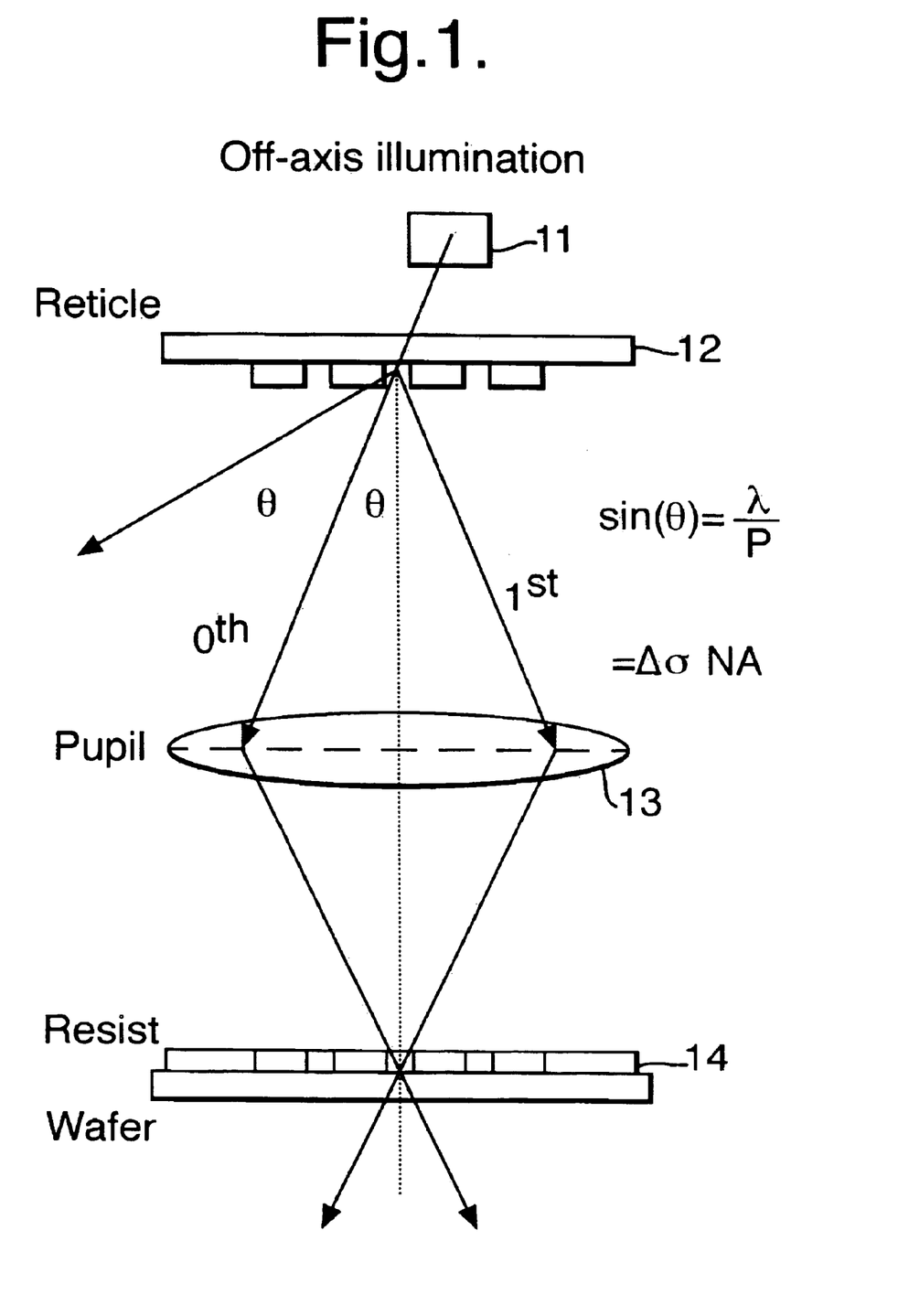
FIG. 1 illustrates the principles of off-axis illumination.
Figure 2:
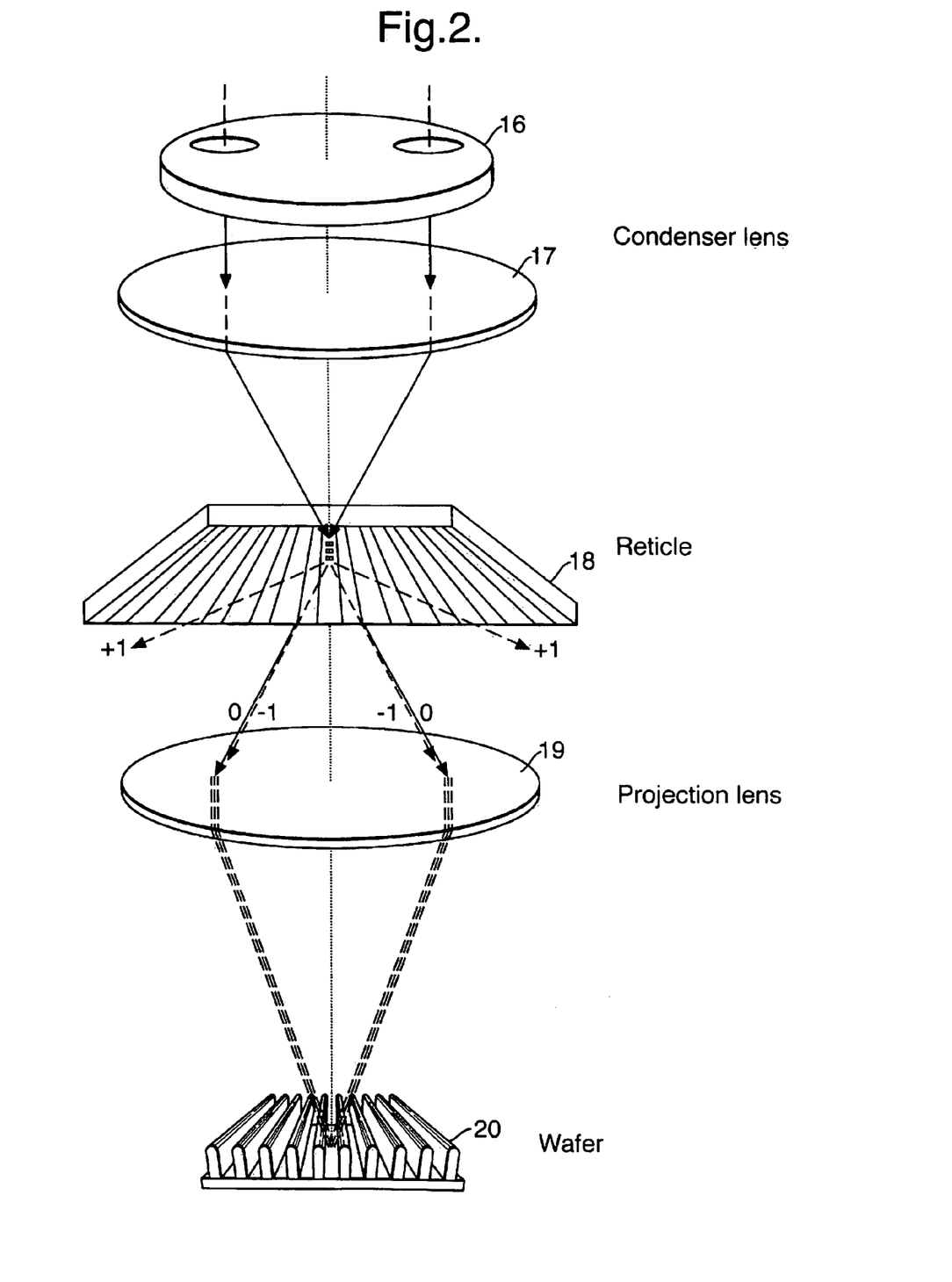
FIG. 2 illustrates the principles of dipole illumination.
Figure 3A:
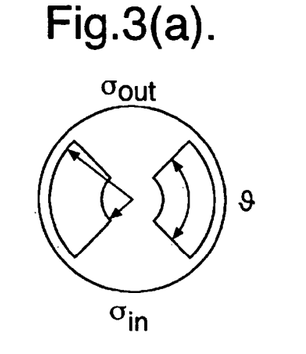
FIGS. 3(a)-3(h) illustrate exemplary shapes of dipole sources.
Figure 3B:
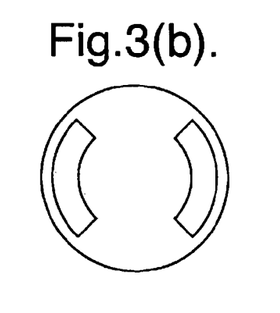
Figure 3C:
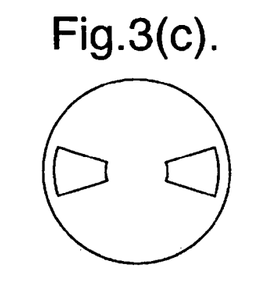
Figure 3D:
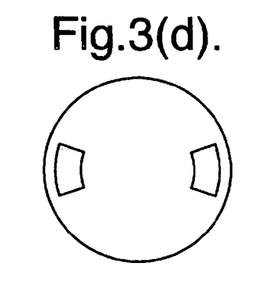
Figure 3E:
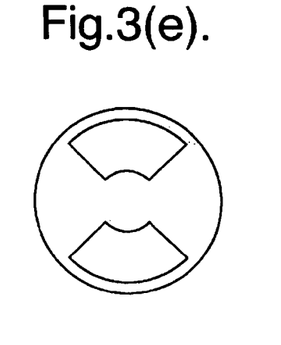
Figure 3F:
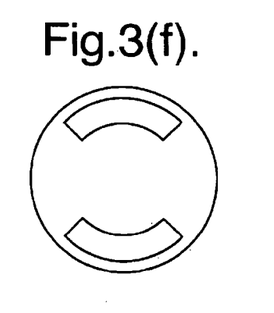
Figure 3G:
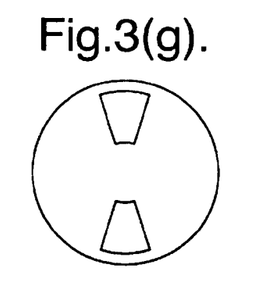
Figure 3H:
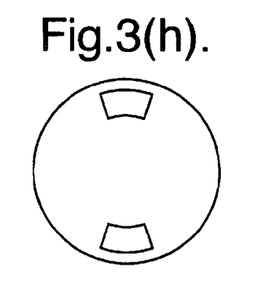

In an Off-Axis illumination regimen, as illustrated in FIG. 1, increased focus latitude and image contrast are achieved by capturing at least one of the first orders of the pattern spatial frequencies. As shown in FIG. 1, a typical off-axis illumination system includes in-part a light source 11, a mask 12, a lens 13 and the wafer 14 covered with photoresist. With dipole illumination, the light source is confined to two poles, in order to create the conditions for two-beam imaging with theoretical infinite contrast. FIG. 2 illustrates the basic principles of dipole imaging. As shown, a dipole illumination system includes in-part a dipole aperture 16 (or other dipole generating means, such as a suitable diffractive optical element), a condenser lens 17, a mask 18, a projection lens 19 and the wafer 20. The dipole apertures 16 can be of various shapes and orientations, e.g., horizontal, vertical or at any given angle. Exemplary dipole apertures 16 of various sizes and shapes are shown in FIGS. 3(a)-3(h).

When dipole illumination is used, resolution is enhanced only for geometrical patterns with orientations perpendicular to the pole orientation axis. For example, a "horizontal" dipole allows the patterning of sub-resolution "vertical" lines or spaces; the terms "vertical" and "horizontal" refer to a set of orthogonal directions in the plane of the geometrical pattern. In a typical dipole application for a layout comprising both horizontal and vertical critical patterns, two exposures are needed with two orthogonal dipole sources, one for each exposure.

As the demand for cheaper, faster, lower power consuming integrated circuits increases, so must the device packing density of the IC. Minimizing transistor dimensions is of paramount importance to the advancement of semiconductor technologies. Minimizing transistor dimensions allows more transistors to be formed in a given area. Minimizing the dimensions also allows the transistors to operate at higher speeds. The ability to place more high speed transistors in an IC allows more complex and sophisticated functionality to be incorporated into the IC device. Therefore, as a result of reducing the size of transistors in an IC, and improving the speed of the IC, products which use these IC's, such as, for example, home computers, will be able to operate faster and with greater functionality than ever before.

Increasing the device packing density of an IC by minimizing transistor dimensions inherently requires that the interconnect technology used to couple transistors together be similarly minimized. In a typical interconnect technology scheme, after transistors are formed on a semiconductor substrate, a layer of dielectric material is used to coat the surface of the transistors to physically and electrically insulate them. Once this dielectric material is deposited, openings are etched through the dielectric material to the underlying semiconductor substrate. Conductive material is deposited into these openings in order to make electrical contact to the substrate surface. These openings filled with conductive material are called contacts.

Once a first layer of interconnects has been deposited on the surface of the first dielectric layer, a second dielectric layer is deposited to coat the surface of this first interconnect layer. Openings are then etched into this second dielectric layer to permit electrical coupling to the first interconnect layer by filling these openings with conductive material. These openings filled with conductive material are called vias. Once the interconnects of the second interconnect layer have been formed, a third dielectric layer is deposited to coat the second interconnect layer, and vias are again formed in the third dielectric layer. This process of forming an interconnect layer, coating with a dielectric layer, forming vias in the dielectric layer, and forming another interconnect layer on its surface may be repeated any number of times in IC manufacturing technology.

The dimensions of these contacts and vias have historically been limited by the photolithographic technology used to define the size and location of contact and via openings. For example, conventional photolithographic technologies are currently capable of defining, or "resolving", an opening having a minimum width of approximately 100 nanometers (nm). This minimum resolvable dimension significantly limits the device packing density of the IC.

Accordingly, there is a need in the art for a method of patterning contact holes with openings less than 100 nm. Additionally, it would be advantageous to produce masks for such contact holes that are simpler to manufacture, thereby decreasing costs.

SUMMARY OF THE INVENTION

According to one aspect of the invention, the invention is directed to a method of a method of forming a feature on a device, including the steps of: forming a photo resist layer over the device; and using a first dipole illuminator having a pole orientation axis in a first direction to expose a first geometrical pattern onto the resist layer, wherein the first geometrical pattern is substantially oriented in the same direction as the pole orientation axis of the dipole illuminator.

Another aspect of the invention is directed to a method of forming a contact hole, including the steps of: forming a photo resist layer over a wafer; aligning the wafer with respect to a first mask, wherein the first mask includes a first geometrical pattern having a first axis that is oriented in a first direction, and the first geometrical pattern includes at least one protrusion having an second axis substantially orthogonal to the first axis of the first geometrical pattern; and using a dipole illuminator to expose the first geometrical pattern on the photo resist layer, wherein a pole orientation axis of the dipole illuminator is substantially parallel to the first axis of the first geometrical pattern.

forming a photo resist layer over a wafer; aligning the wafer with respect to a first mask, wherein the first mask includes a first geometrical pattern that is oriented in a first direction, and the first geometrical pattern includes at least one protrusion along an axis of the first direction; and using a dipole illuminator to expose the first geometrical pattern on the photo resist layer, wherein a pole orientation axis of the dipole illuminator is parallel to the axis of the first direction.

Other aspects, features, and advantages of the invention will become apparent from the following detailed description. It should be understood, however, that the detailed description and specific examples, while indicating several embodiments of the present invention, are given by way of illustration only and various modifications may naturally be performed without deviating from the present invention.

BRIEF DESCRIPTION OF THE DRAWINGS

These and further features of the present invention will be apparent with reference to the following description and drawings, wherein.

DISCLOSURE OF THE INVENTION

In the detailed description that follows, corresponding components have been given the same reference numerals, regardless of whether they are shown in different embodiments of the present invention or at difference times during a wafer processing method. To illustrate the present invention in a clear and concise manner, the drawings may not necessarily be to scale.

The description herein is presented in the exemplary context of fabricating a wafer having an integrated circuit (IC) formed thereon. Example ICs include general purpose microprocessors made from thousands or millions of transistors, a flash memory array or any other dedicated circuitry. One skilled in the art will appreciate that the methods and devices described herein can also be applied to the fabrication of any article manufactured using lithography, such as micromachines, disk drive heads, gene chips, micro electro-mechanical systems (MEMS) and so forth. Additionally, while the invention is described with respect to a double dipole exposure, it will be appreciated that the invention also may be applied to single dipole exposure techniques.

The method described herein utilizes dipole illumination for improving the fabrication of sub-100 nm contact holes. As is known in the art, dipole illumination enhances the resolution of geometrical patterns with orientations orthogonal to the pole orientation axis. Thus, when dipole illuminators with vertical pole orientations are utilized, resolutions are enhanced in the horizontal or "x" direction. Similarly, when dipole illuminators with horizontal pole orientations are utilized, resolutions are enhanced in the vertical or "y" direction. As used herein, a pole orientation axis is defined as an axis intersecting a center point of each aperture of the dipole illuminator.

The present invention employs techniques that are contrary to the conventional techniques utilized in dipole illumination. Briefly, and as will be described in more detail below, geometries oriented in the same direction as a pole orientation axis of a dipole illuminator are utilized to image a contact hole. The geometries include bulges or protrusions that are oriented orthogonal to the main body of the geometries. When exposed to light energy from a dipole illuminator oriented in the same direction as the geometries, the geometries will not be resolved. The bulges, on the other hand, will be resolved, and form a contact hole pattern in a resist layer. Moreover, due to the dipole illumination, the resolution of each contact hole is enhanced.

Figure 4:
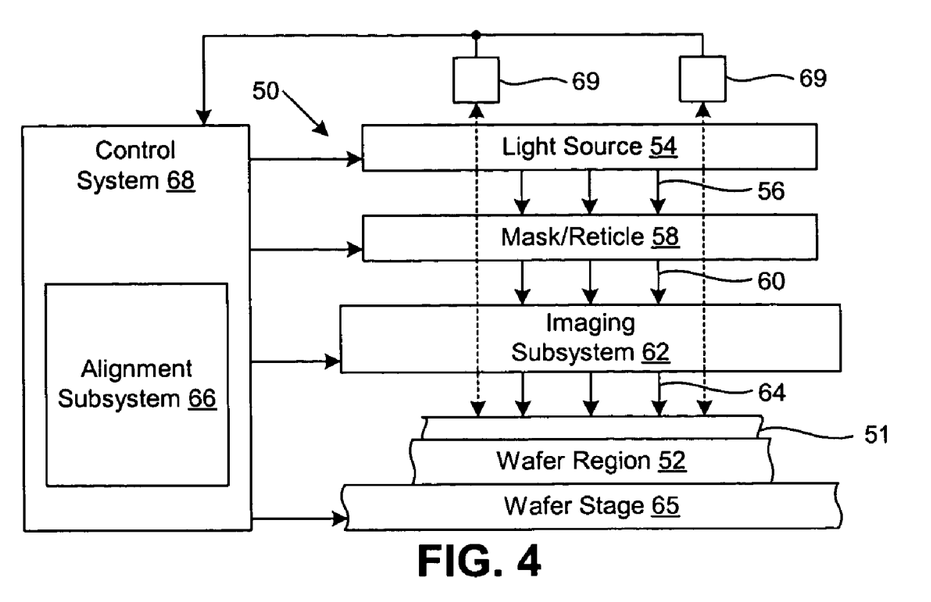
FIG. 4 is a schematic block diagram of an example integrated circuit processing arrangement.

Turning initially to FIG. 4, illustrated is a schematic block diagram of an exemplary integrated circuit processing arrangement that includes a lithography system 50 used to image a pattern onto a photo sensitive layer 51 (e.g., resist), which is formed over a wafer 52, or a region thereof. The system 50 can be, for example, a step-and-repeat exposure system or a step-and-scan exposure system, but is not limited to these example systems. The system 50 can include a light source 54 for directing light energy 56 towards a mask 58 (sometimes referred to as a reticle). The light energy 56 can have, for example, a deep ultraviolet (DUV) wavelength (e.g., about 248 nm or about 193 nm) or a vacuum ultraviolet (VUV) wavelength (e.g., about 157 nm or about 126 nm).

The mask 58, which can be mounted on a stage or chuck (not shown) selectively blocks light energy 56 such that a light energy pattern 60 defined by the mask 58 is transferred towards the wafer 52. An imaging subsystem 62, such as a stepper assembly or a scanner assembly, sequentially directs the energy pattern 60 transmitted by the mask 58 to a series of desired locations on the wafer 52. The imaging subsystem 62 may include a series of lenses and/or reflectors for use in scaling and directing the energy pattern 60 towards the wafer 52 in the form of an imaging (or exposure) light energy pattern 64.

The wafer 52 may be mounted on a wafer stage 65. In one embodiment, the wafer stage 65 can be moved relative to the imaging subsystem 62 so as to place a desired portion of the wafer 52 in the path of the exposure pattern 64. Alternatively, the imaging optics can be movable and/or the exposure pattern can be optically retargeted. Between each sequential illumination of the wafer 52 with the exposure pattern 64, alignment of the exposure pattern 64 and the wafer 52 can be established with the use of reference marks (sometimes referred to as scribe marks if the reference marks are placed in scribe lines of the wafer).

To assist in aligning the wafer 52 with respect to the exposure pattern, the lithography system 50 can include an alignment subsystem 66. The alignment subsystem 66 may be a part of a general control system 68 for the lithography system 50. Wafer alignment subsystems are relatively well known in the art and, therefore, the details of such systems are omitted.

Figure 5A:
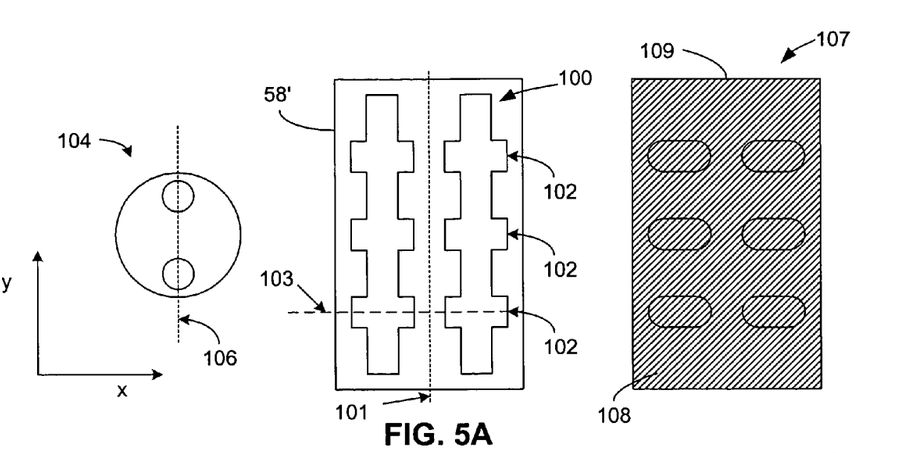
FIG. 5A illustrates a dipole illuminator and a first set of geometries, which are used to image a contact hole in accordance with an embodiment of the present invention.
Figure 5B:
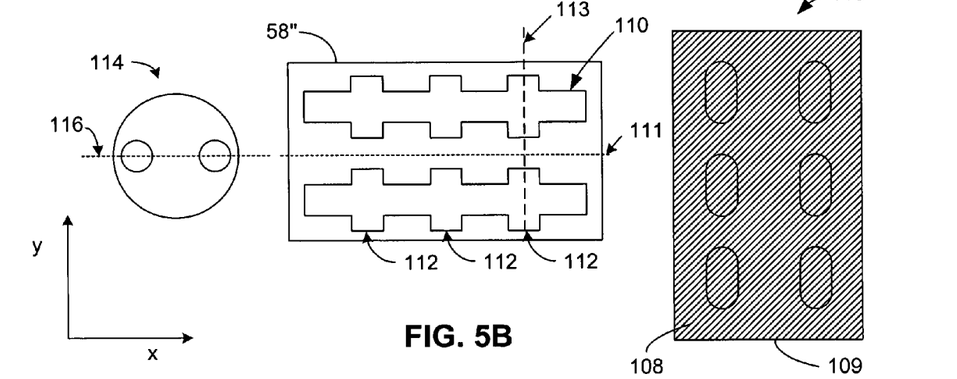
FIG. 5B illustrates a dipole illuminator and a mask that includes a second set of geometries, which are used to image a contact hole in accordance with an embodiment of the present invention.

Turning now to FIGS. 5A-5B, exemplary geometries that can be utilized for imaging contact holes in accordance with the present invention are illustrated. FIG. 5A illustrates a first set of geometries 100 that lie in a vertical plane 101. As used herein, a geometry that lies in the vertical plane refers to a geometry that is predominantly dimensioned along the vertical or "y" axis, e.g., a vertical line, a vertical bar, etc. Additionally, the geometries 100 include a series of bulges 102, which extend out from the vertical plane 101 of the geometries. The bulges 102 have an axis 103 that is substantially orthogonal to the vertical axis 101.

The shape and size of the bulges 102 is dependent on the desired feature pattern as well as the feature size. For example, the bulges required to form a circular shape contact having a diameter of about 100 nm may be different than the bulges required to form a circular shape contact having a diameter of about 90 nm. Simulation software, such as software used to approximate optical proximity effects and/or optical proximity corrections can be used to determine the required size and shape of the bulges. Such simulation software is well known in the art and therefore will not be discussed herein.

As will be appreciated, the geometries 100 can be formed on a mask 58', which can be illuminated via a light source 54 to project an image of the geometries on a target device, such as a wafer 52, for example. A dipole illuminator 104 also is shown in FIG. 5A, wherein a pole orientation axis 106 of the dipole illuminator also lies in the vertical plane (i.e. the pole orientation axis 106 is parallel to the vertical axis 101 of the geometries 100). When the geometries 100 on the mask 58' are illuminated by the dipole illuminator 104, features of the geometries that lie in the same plane as the pole orientation axis 106 of the dipole illuminator 104 are not resolved (i.e., they do not image). Conversely, features that are orthogonal to the pole orientation axis 104 are resolved and, more importantly, the orthogonal features have enhanced resolution when compared to non-dipole illuminated features. Thus, the bulges 102 of the geometries 100 are imaged, while the remainder of the geometries 100 is not imaged. An exemplary pattern 107 obtained in a photo resist layer 108 (which was deposited on a wafer 109) by imaging the geometries 100 with the dipole illuminator 104 also is shown in FIG. 5A.

FIG. 5B illustrates a second set of geometries 110 that lie in a horizontal plane 111. As used herein, a geometry that lies in the horizontal plane refers to a geometry that is predominantly dimensioned along the horizontal or "x" axis, e.g., a horizontal line, a horizontal bar, etc. Additionally, the geometries 110 also include a series of bulges 112, which extend out from the horizontal plane 111 of the geometries. The bulges 112 have an axis 113 that is substantially orthogonal to the horizontal axis 111.

The geometries of FIG. 5B also can be formed on a mask 58", which can be illuminated via a light source 54 to project an image of the geometries on the target device. Also shown in FIG. 5B is a dipole illuminator 114. The dipole illuminator 114 of FIG. 5B has a pole orientation axis 116 that lies in the horizontal plane (i.e. the pole orientation axis 116 is parallel to the horizontal plane 111 of the geometries 110). Exposing the mask (including the geometries 110) with the dipole illuminator 114 produces a second set of images 118.

Exposure of the geometries 110 with the dipole illuminator 114 also produces enhanced resolution. However, the enhancements lie in the vertical plane 101 instead of the horizontal plane 111. For example, when the geometries 110 on the mask are illuminated by the dipole illuminator 114, features of the geometries that lie in the same plane as the pole orientation axis 116 of the dipole illuminator 114 are not resolved, while features that are orthogonal to the pole orientation axis 114 have enhanced resolution. Thus, the bulges 112 of the geometries 110 are imaged, while the remainder of the geometries 110 is not imaged. An exemplary pattern 118 obtained in the photo resist layer 108 by imaging the geometries 110 with the dipole illuminator 114 also is shown in FIG. 5B.

The geometries of FIG. 5A and FIG. 5B, for example, can be utilized in a double dipole exposure system. Double dipole exposure, as used herein, involves using a dipole illuminator to expose a photo resist layer with a first mask image of a mask pair to generate a first mask image and then separately exposing the same photo resist layer with a second mask image of the mask pair to generate a second mask image. As a result, the exposures using each of the masks (e.g., the first and second mask images) are embodied into the same physical layer of photo resist. As one skilled in the art will appreciate, variations to the foregoing basic double dipole exposure technique exist and should be considered to fall within the scope of the term "dual mask exposure." An example variation can include using an additional mask image or images applied to the photo resist material (e.g., a triple mask exposure or higher order mask exposure).

For example, a first mask 58' can include the first set of geometries 100 lying in the vertical plane 101. A dipole illuminator 104 with a pole orientation axis lying in the vertical plane is utilized as a light source 54 to direct light energy 56 towards the mask 58'. The light energy, for example, can have a deep ultraviolet (DUV) wavelength (e.g., about 248 nm or about 193 nm) or a vacuum ultraviolet (VUV) wavelength (e.g., about 157 nm).

The mask 58', which can be mounted on a stage or chuck (not shown) selectively blocks light energy 56 such that a light energy pattern 60 defined by the mask 58' is transferred towards the wafer 52. An imaging subsystem 62, such as a stepper assembly or a scanner assembly, sequentially directs the energy pattern 60 transmitted by the mask 58' to a series of desired locations on the wafer 52. The imaging subsystem 62 may include a series of lenses and/or reflectors for use in scaling and directing the energy pattern 60 towards the wafer 52 in the form of an imaging (or exposure) light energy pattern 64.

After the wafer 52 has been exposed to light energy via the vertically oriented dipole illuminator 104 and a first mask 58' having the first set of geometries 100, the first mask is removed and a second mask 58" having the second set of geometries 110 is mounted on the chuck. A dipole illuminator 114 with a pole orientation lying in the horizontal plane 111 is utilized as the light source 54 to direct light energy 60 towards the mask 58. Following exposure by the horizontal dipole illuminator 114 and the second mask, the photo resist layer 51 can be developed. The developed photo resist layer includes a layout defined by both the first and second mask images.

Figure 5C:
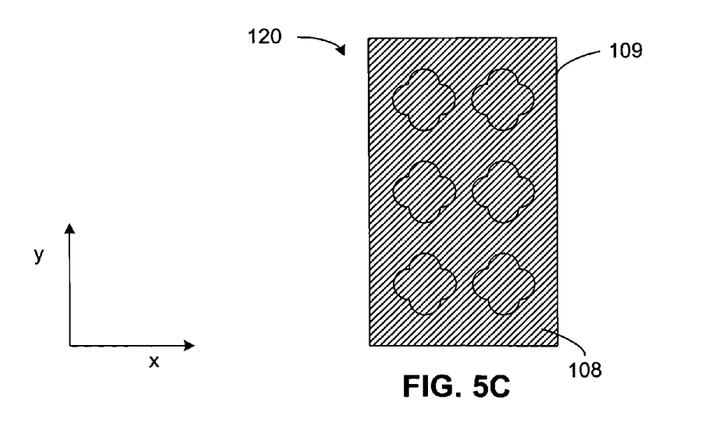
FIG. 5C illustrates a resultant image obtained from a dual mask exposure of the masks of FIG. 5A and FIG. 5B.

Turning now to FIG. 5C, the resulting image 120 of the dual mask exposure utilizing the geometries 100, 110 is shown. The image 120 is a combination of the first set of images 107 superimposed on the second set of images 118. As is evident from the resulting image 120, an approximate circular contact shape is produced. Moreover, due to the enhanced resolution obtained in the horizontal plane utilizing the first dipole illuminator 104 in conjunction with the first set of geometries 100, and the enhanced resolution obtained in the vertical plane utilizing the second dipole illuminator 114 in conjunction with the second set of geometries 110, sub-100 nm contact holes are achievable.

Figure 6:
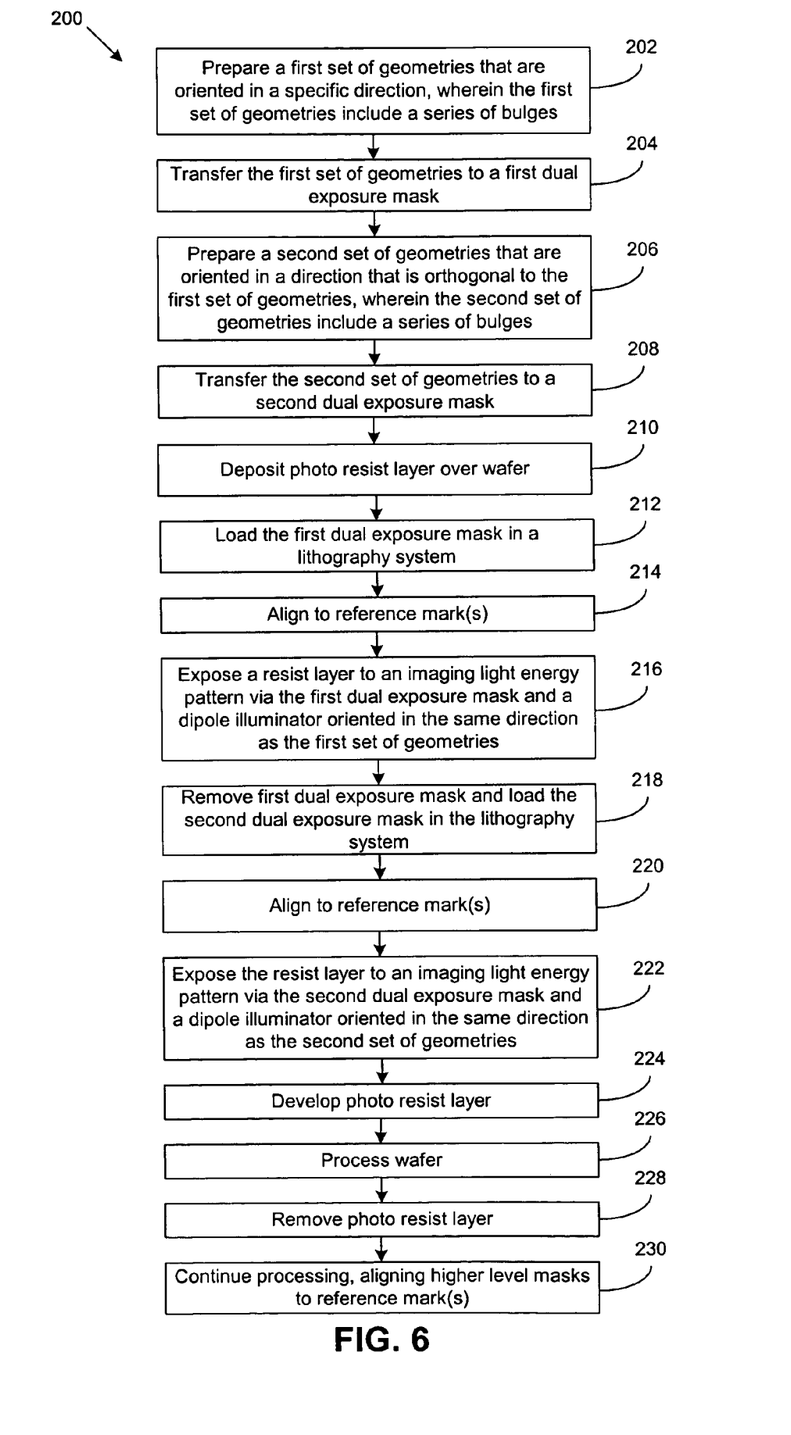
FIG. 6 is a flow diagram of an example technique for fabricating sub-100 nm contact holes in accordance with an embodiment of the present invention.

With additional reference to FIG. 6, a flow diagram of an example technique, or process 200 of forming a contact hole in accordance with the present invention is illustrated. The process 200 can be thought of as depicting steps in a method. The flow diagram includes a number of process blocks arranged in a particular order. Since lithographic processing and double dipole exposure techniques in particular, can vary widely, the illustrated process 200 is merely exemplary. As should be appreciated, many alternatives and equivalents to the illustrated process 200 may exist and such alternatives and equivalents are intended to fall with the scope of the claims appended hereto. Alternatives may involve carrying out additional steps or actions not specifically recited and/or shown, carrying out steps or actions in a different order from that recited and/or shown, and/or omitting recited and/or shown steps. Alternatives also include carrying out steps or actions concurrently or with partial concurrence.

As should as be apparent, the process 200 is described for a double dipole exposure of a particular die area, or other region of the wafer 52, to be exposed by a corresponding pair of mask images (e.g., a second mask image exposed onto the same area as was previously exposed by a first mask image). Between certain processing steps described herein, the wafer 52 may be moved to expose other areas of the wafer 52 (e.g., following a step and repeat technique or scan and repeat technique) or to process the wafer 52 (e.g., to partially develop photo resist material).

The process begins at block 202 where a first set of geometries 100 is prepared. The geometries are oriented in a specific direction, e.g., horizontal, vertical, at 45 degrees with respect to horizontal, etc. Additionally, the first set of geometries includes a series of bulges 102. The bulges extend from a central plane of the geometries, and are arranged to form a first portion of a contact hole image. At block 204, the geometries 100 are formed on a first mask 58', which is used in a double dipole exposure system. Fabrication of masks is well known and the details of such fabrication will not be discussed herein.

Moving to block 206, a second set of geometries 110 is prepared. The geometries 110 are oriented in a direction that is orthogonal to the first set of geometries 100. For example, if the first set of geometries 100 were oriented in the horizontal plane, then the second set of geometries 110 would be oriented in the vertical plane. Similarly, if the first set of geometries 100 were oriented at 45 degrees from horizontal, then the second set of geometries 110 would be oriented at 135 degrees from horizontal. The second set of geometries 110 also includes a series of bulges 112, which correspond to the bulges 102 of the first set of geometries 100. The bulges 112 extend from a central axis of the second set of geometries 110. More importantly, the bulges 112 are oriented so as to correspond to the bulges 102 of the first set of geometries 100.

For example, if, after imaging, the first set of bulges 112 produce a series of images on a photo resist layer that are spaced apart by a predetermined spacing, then the second set of bulges 112 are oriented so as to produce a set of images that are oriented at approximately the same location and spacing on the resist layer. In other words, the second set of bulges 112, when imaged, will produce an image that is superimposed on a set of images produced by the first set of bulges 102. At block 208, the geometries 110 are formed on a second mask 58".

Moving to block 210, a photo resist layer 51 is deposited over the wafer 52 using conventional techniques. At block 212, the first mask 58' for imaging the wafer 52 as part of the double dipole exposure can be loaded into the lithography system 50, and at block 214, the mask 58' is aligned to a reference mark (not shown). The reference mark can be a scribe or the like on the wafer, as is conventional. At block 216, the resist layer 51 is imaged using a dipole illuminator 104 and the first mask 58' to define the exposure pattern 107. The dipole illuminator 104 is oriented with respect to the first set of geometries 100 such that a pole orientation axis 106 of the dipole illuminator is parallel to the first set of geometries 100. The exposure pattern 107 defined by the first mask can be considered a first mask image.

The process 200 can continue in block 218 where the first mask 58' is removed from the lithography system 50 and the second mask 58", which includes the second set of geometries 110, is loaded into the lithography system. The second mask 58" is aligned to the reference mark (not shown), as indicated at block 220. At block 222, the resist layer 51 is exposed to an imaging light energy pattern 64, which is generated by a dipole illuminator 114 and the second mask 58". The dipole illuminator 114 is oriented with respect to the second set of geometries 110 such that a pole orientation axis 116 of the dipole illuminator is parallel to the second set of geometries 110 (i.e., orthogonal to the first set of geometries).

Moving to block 224, the photo resist layer 51 is developed using conventional techniques. The developed photo resist layer can include a layout defined by both the first and second mask images. This layout of the developed photo resist layer 51 can be used in connection with additional processing of the wafer 52 in block 226. The processing of the wafer 52 can include etching the underlying wafer to form contact holes, for example.

After the photo resist layer 51 is no longer desired, the photo resist layer can be removed in block 228. Removal techniques, such as dry ashing, are relatively well known in the art and will not be discussed in greater detail.

Processing of the wafer 52 can continue in block 230. The processing of block 230 can include depositing and/or patterning additional photo resist layers on the wafer 52.

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of forming a feature on a device, comprising the steps of:
    forming a photo resist layer over the device; and
    using a dipole illuminator having a pole orientation axis in a first direction to expose a first geometrical pattern onto the resist layer, wherein a longitudinal axis of the first geometrical pattern is substantially oriented in the same direction as the pole orientation axis of the dipole illuminator.

2. The method of claim 1, further comprising the step of:
    using a dipole illuminator having a pole orientation axis substantially orthogonal to the first direction to expose a second geometrical pattern onto the resist layer, wherein a longitudinal axis of the second geometrical pattern is oriented substantially orthogonal to the first direction.

3. The method of claim 2, further comprising the step of forming at least one first protrusion along the first geometrical pattern, wherein a longitudinal axis of the at least one first protrusion is substantially orthogonal to the orientation of the longitudinal axis of the first geometrical pattern.

4. The method of claim 3, further comprising the step of forming the at least one first protrusion based on a simulation performed on at least one first test geometrical pattern and first test protrusion.

5. The method of claim 3, further comprising the step of forming at least one second protrusion along the second geometrical pattern, wherein a longitudinal axis of the at least one second protrusion is substantially orthogonal to the orientation of the longitudinal axis of the second geometrical pattern.

6. The method of claim 5, further comprising the step of forming the at least one second protrusion based on a simulation performed on at least one second test geometrical pattern and second test protrusion.

7. The method of claim 1, further comprising the step of using a light source having a deep ultra-violet (DUV) wavelength.

8. The method of claim 7, wherein the step of using a light source having a DUV wavelength includes using a wavelength of about 365 nanometers (nm), about 248 nm or about 193 nm.

9. The method of claim 1, further comprising the step of using a light source having a vacuum ultra-violet (VUV) wavelength.

10. The method of claim 9, wherein the step of using a light source having a VUV wavelength includes using a wavelength of about 157 nanometers (nm) or about 126 nm.

11. The method of claim 1, wherein the feature is less than about 100 nm in diameter.

12. The method of claim 1, further comprising the step of developing the photo resist layer to expose a feature pattern.

13. The method of claim 12, further comprising the step of etching the device to form a feature.

14. The method of claim 1, wherein the pole orientation axis is parallel to the longitudinal axis of the first geometrical pattern.

15. The method according to claim 1, wherein said pole orientation axis and said longitudinal axis of the first geometrical pattern lie in the vertical plane.

16. A method of forming a feature on a device, comprising the steps of:
    forming a photo resist layer over the device; and
    using a dipole illuminator having a pole orientation axis in a first direction to expose a first geometrical pattern onto the resist layer, wherein said first geometrical pattern is an elongated shape with a major axis and a minor axis, and wherein said major axis of the first geometrical pattern is substantially oriented in the same direction as the pole orientation axis of the dipole illuminator.

17. The method of claim 16, further comprising the step of using a dipole illuminator having a pole orientation axis substantially orthogonal to the first direction to expose a second geometrical pattern onto the resist layer, wherein said second geometrical pattern is an elongated shape with a major axis and a minor axis, and wherein said major axis of the second geometrical pattern is oriented substantially orthogonal to the first direction.

* * * * *